(12) United States Patent
Ice

(10) Patent No.: US 7,341,385 B2
(45) Date of Patent: Mar. 11, 2008

(54) SHAPED LEAD ASSEMBLY FOR OPTOELECTRONIC DEVICES

(75) Inventor: Donald A. Ice, Milpitas, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/537,645

(22) Filed: Sep. 30, 2006

(65) Prior Publication Data

US 2007/0047882 A1 Mar. 1, 2007

Related U.S. Application Data

(62) Division of application No. 11/173,464, filed on Jun. 30, 2005.

(60) Provisional application No. 60/584,217, filed on Jun. 30, 2004.

(51) Int. Cl.
G02B 6/36 (2006.01)
(52) U.S. Cl. .............................. 385/92; 385/88; 385/89
(58) Field of Classification Search ............ 385/88–89, 385/92; 439/378–381, 574
See application file for complete search history.

(56) References Cited

U.S. PATENT DOCUMENTS 5,692,912 A * 12/1997 Nelson et al. ................. 439/79
6,769,818 B2 * 8/2004 Wu ............................. 385/92

* cited by examiner

Primary Examiner—Hemang Sanghavi
Assistant Examiner—Kajli Prince
(74) Attorney, Agent, or Firm—Workman Nydegger

(57) ABSTRACT

An optical subassembly is used in connection with an optoelectronic package with a shaped lead configuration. The lead configuration enables the shaped leads to electrically connect with through-hole vias defined in a printed circuit board while minimizing space requirements and providing stress relief for the leads. In one embodiment, an optical subassembly is disclosed, comprising a header containing optoelectronic components, and a plurality of conductive leads that are in operable communication with the optoelectronic components. Each lead includes a straight portion extending from a surface of the header, an end portion oriented so as to be received by a through-hole via defined in a printed circuit board, and a shaped portion interposed between the straight and end portions and having at least one bend defined in a first plane. The optical subassembly further includes a clip assembly having a plurality of cavities that each receive a corresponding one of the leads.

15 Claims, 9 Drawing Sheets

SHAPED LEAD ASSEMBLY FOR OPTOELECTRONIC DEVICES

CROSS-REFERENCE TO RELATED APPLICATIONS

This application is a divisional of U.S. patent application Ser. No. 11/173,464, filed Jun. 30, 2005, which claims the benefit of U.S. Provisional Patent Application No. 60/584,217, filed Jun. 30, 2004. The foregoing patent applications are incorporated herein by reference.

BACKGROUND

1. Technology Field

The present invention relates to optoelectronic devices. More particularly, the present invention relates to systems and methods for connecting optoelectronic subassemblies to electrical circuits, for example, a printed circuit board.

2. The Related Technology

Fiber-optic and optoelectronics are an important aspect of modern networking circuits because they allow for efficient, accurate, and rapid transmission of data between various components in the network system. As with the design of most systems, design considerations often determine the extent of use of a fiber optic system. For example, the size and modularity of components or devices must often be balanced against the need for additional space to accommodate heat dissipation and circuit monitoring components. While it is desirable to minimize a component's size, some design considerations have previously limited this minimization due to their inherent characteristics. For example, some optoelectronic components generate large amounts of heat, which becomes more difficult to dissipate as the size of the component becomes smaller. Further, as the component becomes smaller, there is less space available for mounting and connecting additional components thereto.

Modular components are desirable in fiber optic systems to reduce the cost of manufacturing the system, which cost increases the more customized the system becomes. An example of a modular component is an optical transceiver module ("transceiver"). Transceivers usually include an input receiver optical subassembly ("ROSA") and an output transmitter optical subassembly ("TOSA"). The ROSA includes a photodiode for detecting optical signals and sensing circuitry for converting the optical signals to digital electrical signals compatible with other network components. The TOSA includes a light source, such as a laser, for transmitting optical signals and control circuitry for modulating the laser according to an input digital electrical data signal. The TOSA also includes an optical lens for collimating the light signals from the laser of the TOSA to an optical fiber. Additionally, the transceiver includes pluggable receptacles for optically connecting the TOSA and the ROSA with other components within a fiber optic network. The transceiver further includes an electronic connector for mating with a host system, such as a computer or communication device, with which the transceiver operates.

As mentioned, photodiodes and lasers are employed in the ROSA and TOSA, respectively, and as such are examples of optoelectronic components. Generally, these optoelectronic components are sensitive electrical devices, and therefore require environmental protection. In response to this need, the photodiode and laser are usually positioned in packaging assemblies within the respective ROSA or TOSA. One such packaging assembly is known as a transistor-outline header or transistor-outline package, referred to herein as a "TO package" or "TO can." TO packages are widely used in the field of optoelectronics, and may be employed in a variety of applications. As such, the size of TO packages is often standardized to facilitate their incorporation into optoelectronic devices, such as ROSAs and TOSAs. TO packages protect the sensitive components contained therein and electrically connect such devices to external components such as printed circuit boards ("PCBs"), which are also located in the transceiver.

With respect to their construction, TO packages often include a cylindrical metallic base with a number of straight conductive leads extending therethrough in an arrangement that is generally perpendicular to the base. The size of the base and its respective lead configuration is typically designed to fit within one of a variety of standard form factors, such as TO-5 or TO-46 form factors, for instance. The TO package leads are usually hermetically sealed in the base in such a way as to provide mechanical and environmental protection for the components contained in the TO package, and to electrically isolate the leads from metallic portions of the base. Typically, one of the conductive leads is a ground lead that may be electrically connected directly to the base.

Various types of electrical devices are mounted on an interior surface of the TO package base and connected to the leads. Generally, a cover is used to enclose this interior surface where such electrical devices are mounted, thereby forming a chamber with the base that helps prevent contamination or device damage.

The particular design of the TO package depends on both the type of optoelectronic device that is mounted on the base and the configuration of the modular component with which the TO package will operate. By way of example, in applications where the optoelectronic device mounted on the base is an optical device such as a laser or photodiode, the cover of the TO package includes a transparent optical window so to allow an optical signal generated or received by the optical device to be transmitted to or from the TO package. These optical TO packages are also known as window cans.

Certain challenges exist when connecting the TO package to other components of a system or device, such as the transceiver discussed above, in which the TO package is located. For example, the conductive lead configuration of a conventional TO package limits how the package, and ultimately, the modular component to which it is associated, is connected to other components of the transceiver, e.g., the PCB. One attempt at solving this problem has involved positioning the TO package on its side such that the base thereof is perpendicular to the PCB surface. This configuration may be desirable where the optical window is disposed at an end of the can for the emission or reception of an optical signal. The leads of the TO package in this configuration linearly extend from the package base and straddle opposing surfaces of the PCB such that some of the leads are positioned adjacent solder pads located on a top surface of the PCB while other leads are positioned adjacent solder pads on a bottom PCB surface. The leads are soldered to the PCB pads in a surface-mount configuration. So configured, the TO package can be disposed in a TOSA or ROSA port to form part of a respective TOSA/ROSA subassembly of the transceiver.

Various challenges arise with the above TO package configuration as well, however. For instance the spacing of the leads exiting the TO package can sometimes vary such that it fails to match the thickness of the printed circuit board. Generally, the leads of the TO package ideally should rest just adjacent to and along the length of the solder pads of the PCB. Frequently, because of this mis-match between the TO package lead spacing and PCB thickness, however, the ends of the leads must be specially manipulated so that the lead ends can suitably lie parallel and against the corresponding PCB pads. This requires either very specialized tooling or manual lead forming. If done manually, lead forming frequently results in imperfect and irregular solder joints of poor quality. Further, such manual lead forming operations can crack or otherwise damage the glass-to-metal seals used to enable passage of the leads through the TO package base. Manual lead forming operations also result in additional assembly cost.

TO packages having leads as explained above can result in other challenges as well: the TO package leads in this configuration are unsupported between the base and the PCB and are thus unable to withstand torque, gravitational, jostling, or other displacement forces that may be imposed on the leads during use. Failure of the TO package leads, breakage of the solder bond between the leads and the PCB, and/or failure of the PCB pads are the likely result. In addition, stress applied to the TO package and its leads can translate through the relatively rigid PCB to damage other PCB-connected components.

Another approach in attempting to resolve some of the challenges discussed above has involved the connection of TO package leads to PCB pads using a flexible circuit. In this configuration, a TO package is positioned such that its base is perpendicular with respect to the top surface of the PCB. A flexible circuit electrically interconnects electrically contacts on the TO package base with pads on the surface of the PCB. One advantage of this configuration includes the ability of the flexible circuit to allow the optical subassembly in which the TO package is located to "float" slightly in the transceiver housing so that, when a connectorized optical fiber is plugged into a port associated with the optical subassembly, the port and attached optical subassembly can self-align so that it connects to the fiber properly.

Notwithstanding their utility, flexible circuits add significant cost to transceiver assembly, both in terms of extra materials and additional steps required for flexible circuit attachment to the PCB and TO package. In particular, flexible circuit connection to the contacts of the TO package must typically be performed via semi-manual soldering using a hot bar process. For connection with the PCB, solder paste is first stenciled atop pads on the PCB surface before corresponding pads on the flexible circuit are mated with the PCB pads. Heat and pressure are then applied to the region to reflow the solder joint and solidify the pad connection. The interconnection so formed is referred to as a "blind solder joint." As such, the connection must be x-rayed to determine whether the solder joint was properly formed. While portions of the above process can be automated, it nonetheless represents a significant portion of transceiver assembly time.

As seen by the above discussion, various known TO package-to-PCB interconnection schemes suffer from various challenges, including propensity for stress-induced damage, and labor-intensive assembly procedures. Thus, a need exists for a connection scheme that enables electronic device component interconnection without creating the above-described challenges. Any solution to this need should facilitate the connection of an optoelectronic component, such as a TO package, to a corresponding component, such as a printed circuit board, within an optical transceiver module. Such a solution should present a reliable and efficient interconnection scheme, thereby maximizing utility of the transceiver in a variety of operating conditions.

BRIEF SUMMARY

The present invention has been developed in response to the above and other needs in the art. Briefly summarized, embodiments of the present invention are directed to a shaped lead configuration for use by an optoelectronic package in electrically connecting to another component, such as a printed circuit board. The shaped leads are configured to acceptably connect with a plurality of through-hole vias defined in the printed circuit board, thereby ensuring a secure connection to be established between the printed circuit board and the package, which in present embodiments includes a receiver- or transmitter-equipped optical subassemblies. Further, the shaped leads provide a measure of strain relief between the package and the printed circuit board to reduce stress-induced breakage of the components. Moreover, the shaped lead configuration is designed to reduce the time required for connection of the optoelectronic package to the printed circuit board, thereby reducing overall assembly time.

In one embodiment, an optical subassembly is disclosed, comprising a header containing optoelectronic components, and a plurality of conductive leads that are in operable communication with the optoelectronic components. Each lead includes a straight portion extending from a surface of the header, an end portion oriented so as to be received by a through-hole via defined in a printed circuit board, and a shaped portion interposed between the straight and end portions and having at least one bend defined in a first plane. The optical subassembly further includes a clip assembly having a plurality of cavities that each receive a corresponding one of the leads such that the end portion of each lead extends from a surface of the clip.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SELECTED EMBODIMENTS

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1-6 depict various features of embodiments of the present invention, which is generally directed to a shaped lead frame configuration for use in connection with optoelectronic devices, including transmitter and receiver optical subassemblies of an optical transceiver module. In particular, embodiments to be described herein relate to a lead frame configuration that permits the electrical connection of an optoelectronic device containing optoelectronic components, or another similar package to other components, such as a printed circuit board within an optical transceiver module.

Figure 1:
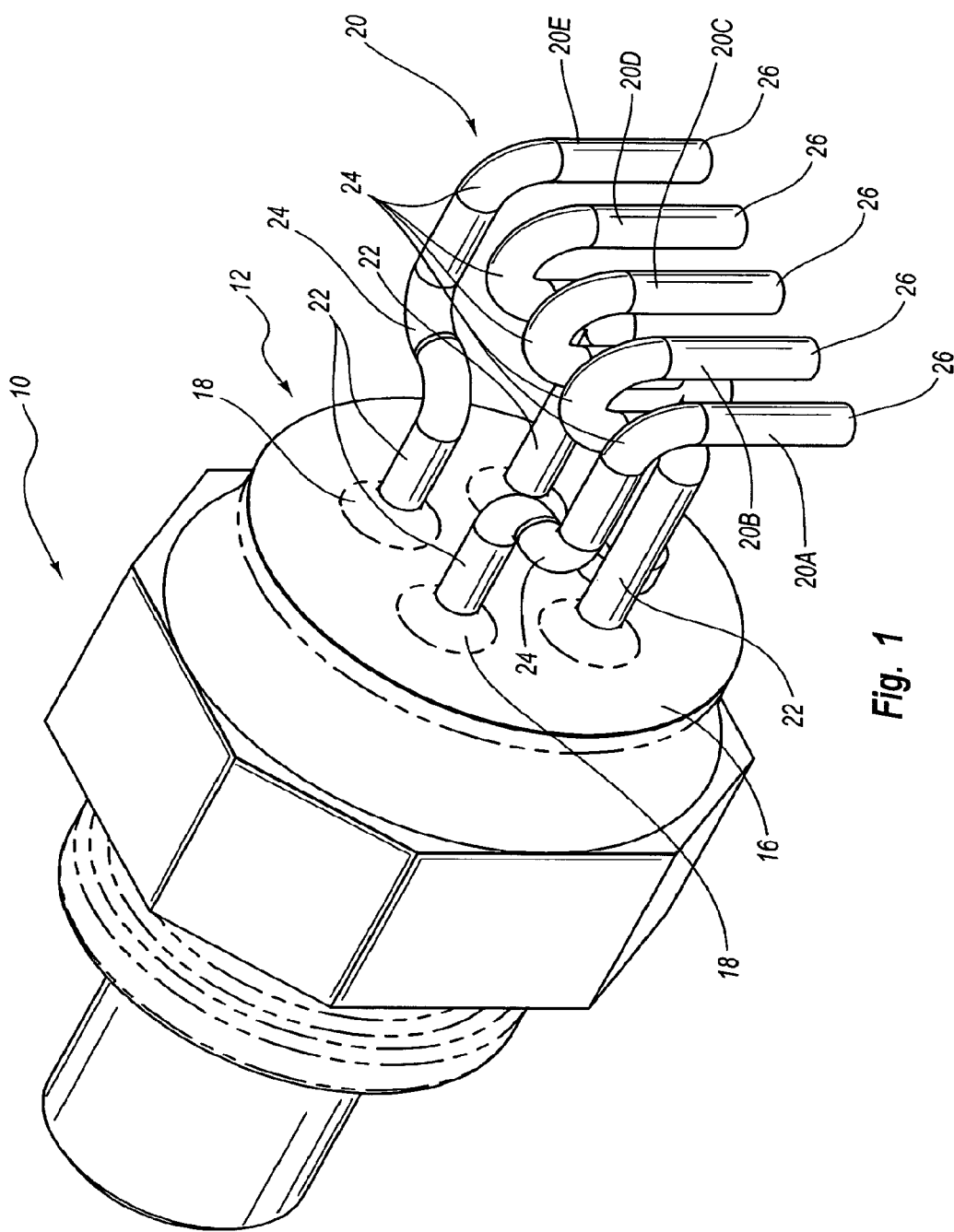
FIG. 1 is a perspective view of a receiver optical subassembly having shaped leads according to one embodiment of the present invention.
Figure 6:
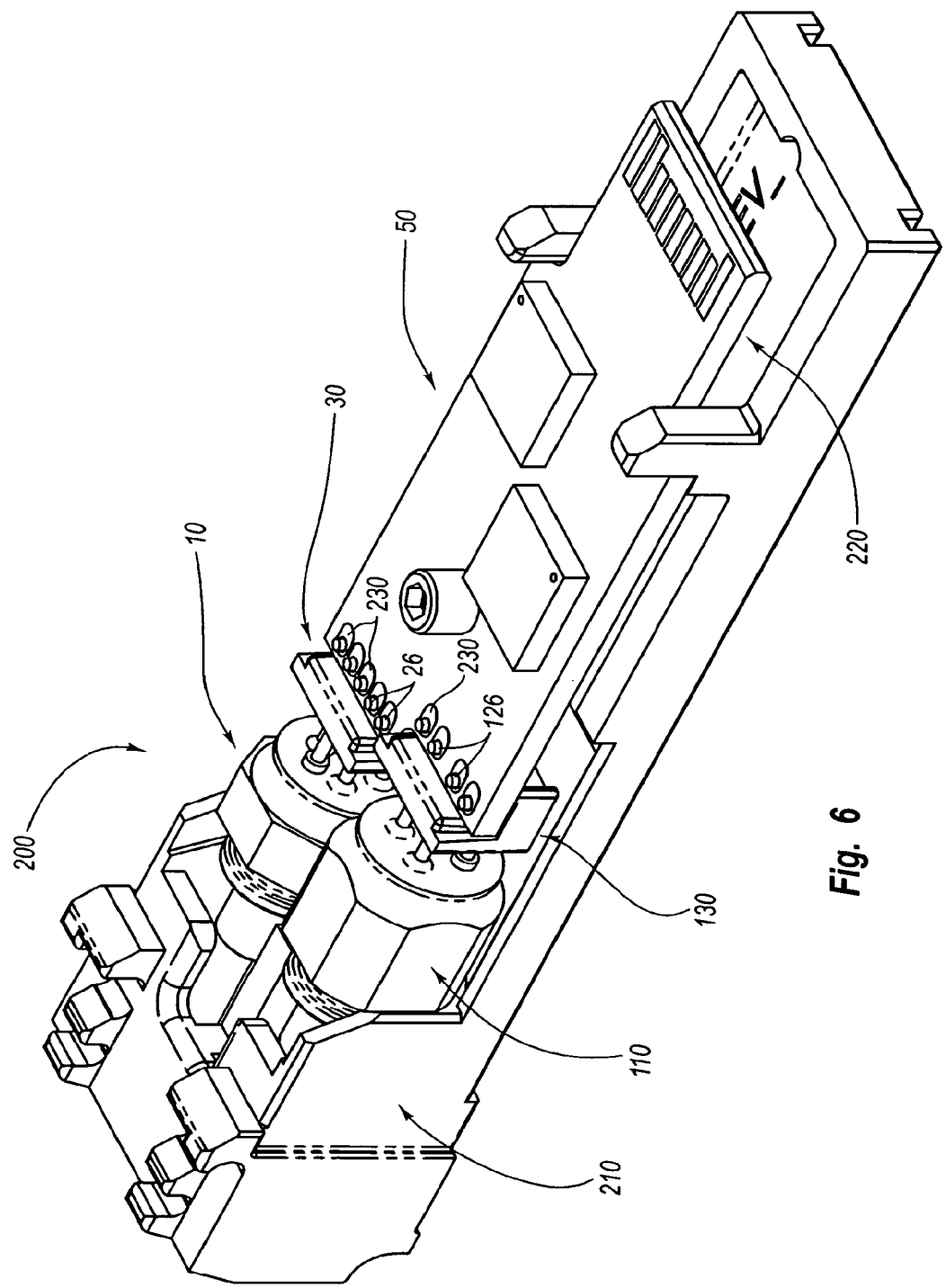
FIG. 6 is a perspective view of an optical transceiver module incorporating a shaped lead configuration and clip assembly according to one embodiment of the present invention.

Reference is first made to FIG. 1, which describes various details regarding the shaped lead configuration of embodiments of the present invention. In particular, a receiver optical subassembly ("ROSA"), generally designated at 10, is shown. The ROSA 10 includes as part of its structure a transistor-outline ("TO") package, or header 12, containing one or more optoelectronic components. In the present embodiment, the header 12 of the ROSA 10 includes a photodiode (not shown) configured to receive and sense optical signals received by the ROSA for conversion into electrical signals. This configuration is commensurate with use of the ROSA within an optical transceiver module ("transceiver"), as shown in FIG. 6. As such, the ROSA serves as one example of an optoelectronic package. In addition, other devices can benefit from the principles of the present invention contained herein. As such, the features of the ROSA 10 are not necessarily significant to this particular invention, but are provided for purposes of enablement.

The header 12 includes a base 16 having defined therein a plurality of glass seals 18, through each of which extends one of a plurality of conductive leads 20. The glass seals 18 are employed to electrically isolate the leads, individually designated by letters A-E, from the base 16. The leads 20A-E serve to electrically interconnect components contained in the header 12, such as the optoelectronic components referred to above, with components, supplies, etc., that are located outside of the ROSA 10. In one embodiment, the leads 20A-E are in electrical communication with a printed circuit board positioned outside of the ROSA 10, as will be described. As such, each lead 20A-E includes an interior portion (not shown) disposed within the package 12 and an exterior portion, as shown in FIG. 1. The interior portion of each lead 20A-E can electrically connect with intra-header components either directly or indirectly via bond wires or the like. These two portions are generally defined as existing on either side of the respective glass seal 18. In one embodiment, the lead diameter is approximately, 16-19 mils.

Each lead 20A-E includes various portions in accordance with one embodiment. In general, the leads 20A-E are shaped so as to provide an acceptable path for electrical signals to and from interiors components of the header 12, while satisfying space, form factor, and other requirements of the device in which the ROSA 10 or other component with which the leads are associated is positioned.

In detail, each lead 20A-E includes a straight portion 22, a shaped portion 24, and an end portion 26. The straight portion 22 of each lead 20A-E is adjacent the base 16 and respective glass seal 18. This portion provides a location where each lead 20 may be grasped manually or mechanically in order to form the other portions of the lead without causing damage to the glass seal 18, the lead 20, or package 12. As shown in the present embodiment, the straight portion 22 of each lead 20 extends substantially perpendicularly from the surface of the base 16, and the straight portions are substantially parallel to one another.

The shaped portion 24 of each lead 20A-E is located adjacent the straight portion 22. The configuration of each shaped portion 24 varies according to the particular lead 20 and lead position on the package 12. For instance, adjacent middle leads 20B, C, and D include shaped portions 24 that are defined by U-shaped bends defined in a single, common plane. In contrast, the shaped portions 24 of leads 20A and E include bends—S-shaped and L-shaped bends—in two orthogonal planes, one of which is common with the bend plane of the middle leads 20B-D, in order to align the end portions 26 of these leads with those of the middle leads.

As a result of the configuration of the shaped portions 24, the end portion 26 of each lead 20A-E is straight and oriented in a parallel arrangement with respect to one another and with respect to the surface of the base 16. This arrangement also places the end portions 26 orthogonal to the straight portions 22 of the leads 20A-E. So configured, each lead end portion 26 is properly oriented for receipt into a through-hole via of a printed circuit board or other suitable component, as will be shown below.

Note that the leads 20A-E can be shaped as shown by any suitable process. For example, the leads can be shaped manually. Alternatively, the forming of the leads can be automated during or after manufacture of the package 12.

Figure 2A:
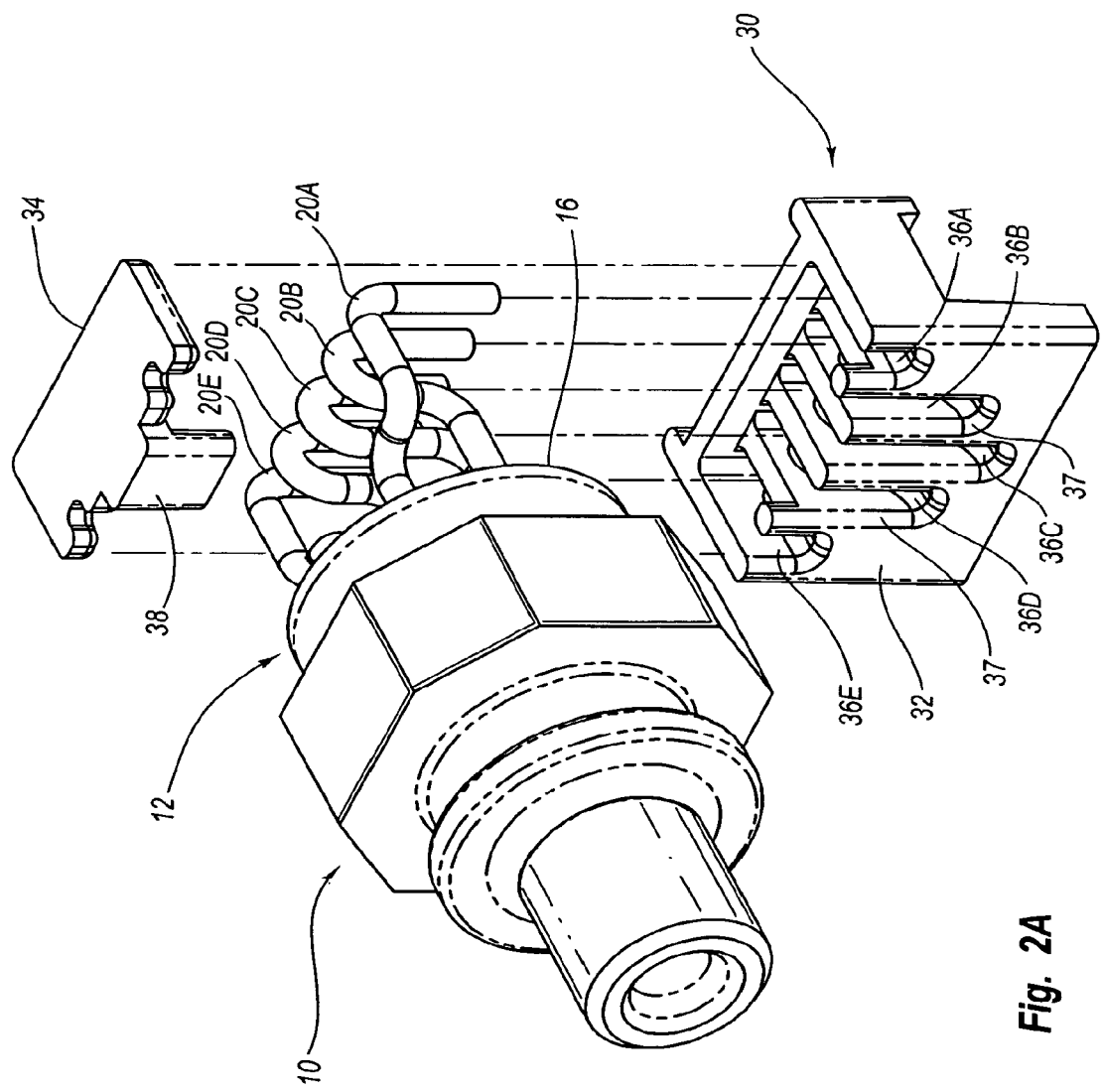
FIG. 2A is an exploded perspective view of a shaped lead configuration including a clip assembly according to one embodiment.
Figure 2B:
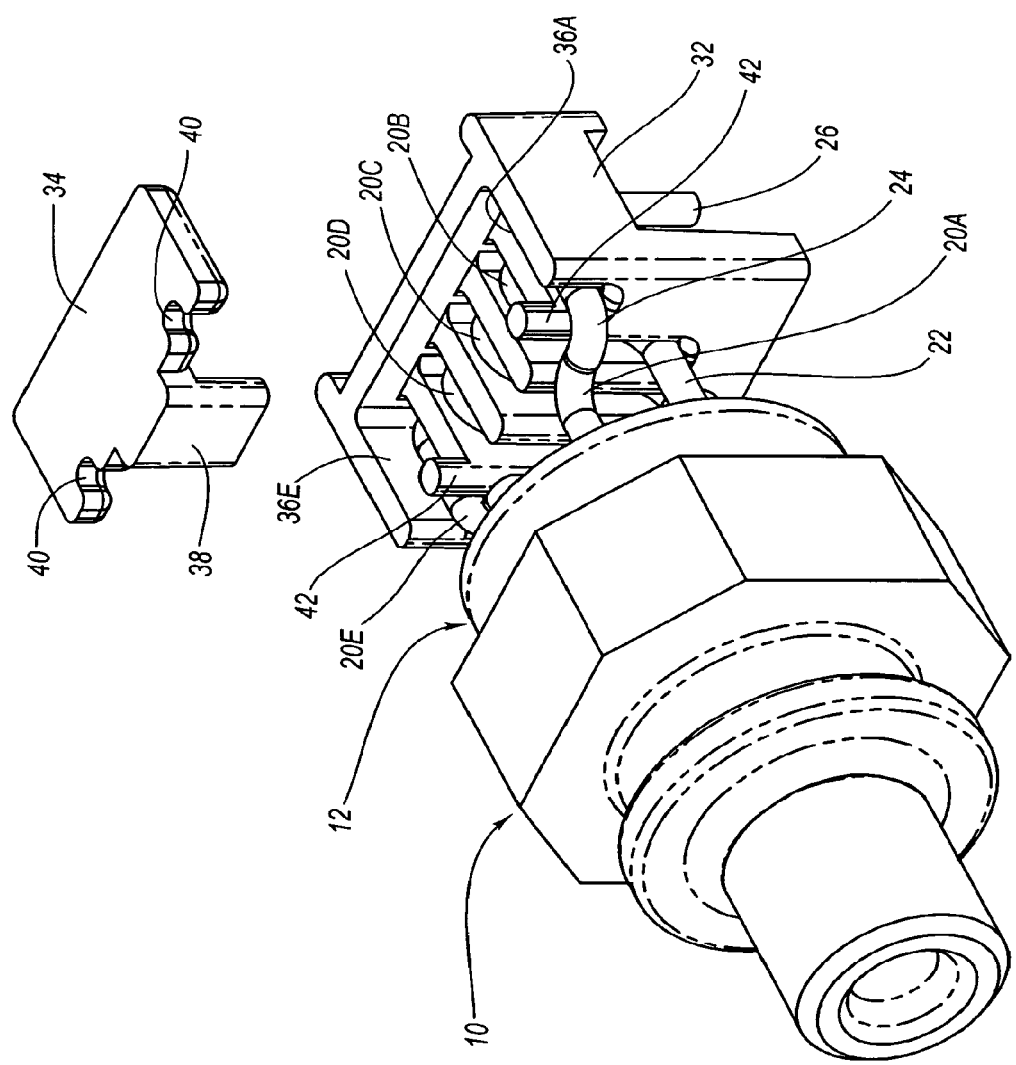
FIG. 2B is a partially assembled view of the shaped lead configuration and clip assembly of FIG. 2A.
Figure 2C:
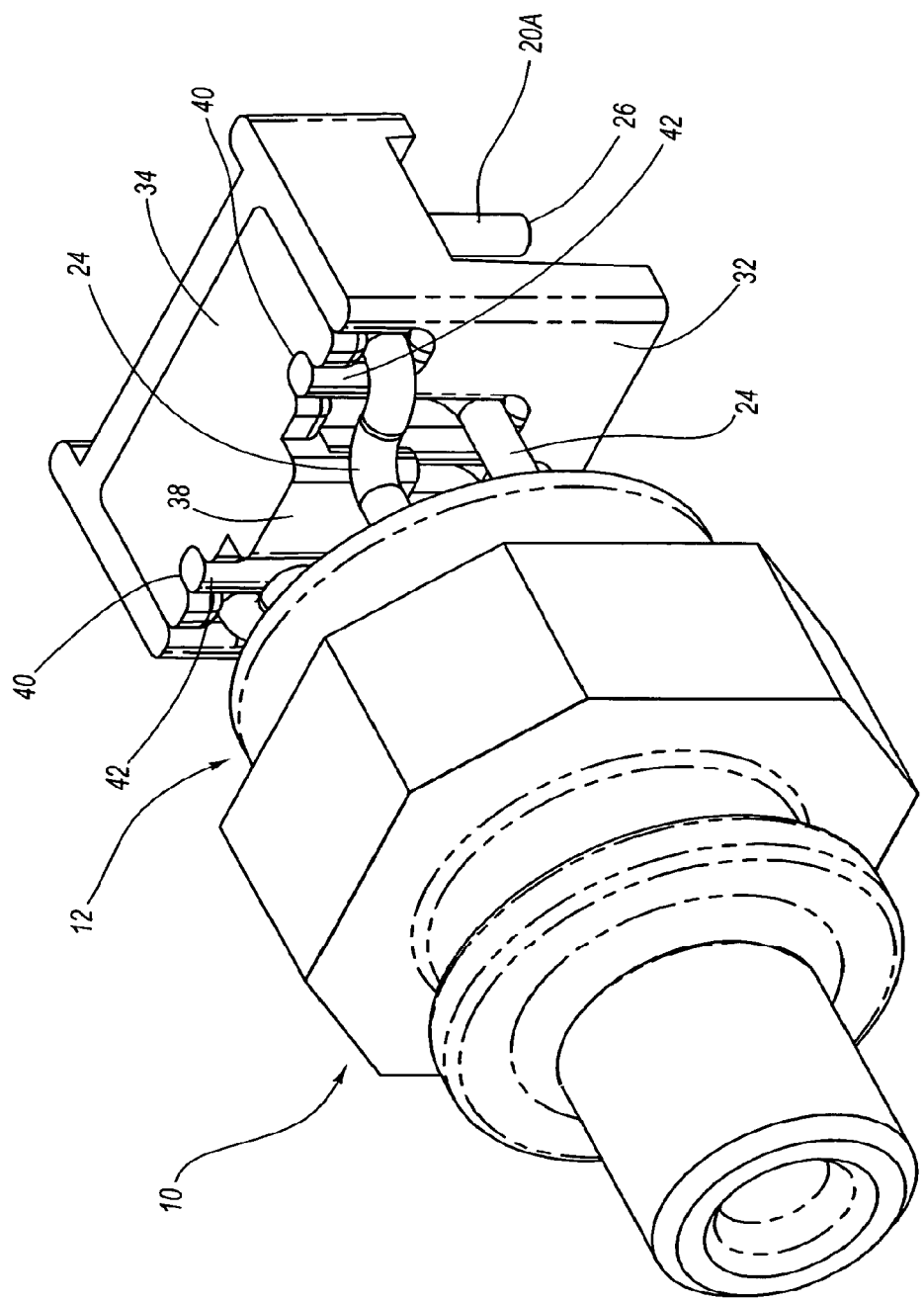
FIG. 2C is a fully assembled view of the shaped lead configuration and clip assembly of FIG. 2A.

Reference is now made to FIGS. 2A-2C, which depict various details of one exemplary implementation of the shaped leads described above. These figures show the ROSA 10 and package 12 with its base 16, together with the leads 20A-E, as has been previously described. Further, FIGS. 2A-2C depict a clip assembly, generally designated at 30, for use with the shaped leads 20A-E. Though one possible implementation is shown here, it is appreciated that the clip assembly can be configured in a number of different ways, commensurate with its purposes, as will be described below. The following discussion of this and other features should therefore not be considered limiting of the present invention in any way.

The clip assembly generally includes a base 32 and cap 34. In detail, the clip base 32 defines a plurality of cavities 36A-E that correspond to and are configured to receive the corresponding lead 20A-E of the package 12. Each cavity 36A-E is sized to receive a portion of the shaped portion 24 of the respective lead 20A-E, and as the particular shape of the shaped portion varies according to the lead, so does the shape of the corresponding cavity 36A-E. As such, it is seen that cavities 36A and E are relatively more shallow than cavities 36B and D, which in turn are relatively more shallow than cavity 36C. The inner surface of each cavity 36A-E can be shaped so as to maintain contact with the surface of the corresponding lead 20A-E when the lead is received into the cavity so as to securely hold the respective portion of the lead without slipping.

The cavities 36A-E are separated from one another in the clip base 32. This in part enables the clip to maintain the end portions 26 of the leads 20A-E in a particular position and orientation with respect to one another so as to facilitate easier coupling with a printed circuit board, as will be described. Thus, even though one or more of the leads 20A-E may be initially biased in an undesired orientation, the clip assembly 30 will correct such bias and maintain the leads in proper respective alignment. This in turn reduces strain that might otherwise be imposed on the mechanical connection between the leads and the Printed circuit board.

FIG. 2B shows the various leads 20A-E received into the corresponding cavities 36A-E, according to one embodiment. Various edges of each cavity 36A-E are rounded with a bevel 37 to assist the insertion of the leads 20A-E into the respective one of the cavities 36A-E. Interior surfaces of the cavities 36A-E can also be rounded to more fully seat the leads 20A-E therein. The leads 20A-E are received such that the end portions 26 thereof extend from the clip base 32 a pre-determined distance. In the present embodiment, the lead end portions extend an equal distance from the clip base 32. Insertion of the leads 20A-E into the clip assembly 30 can be performed manually or by machine.

FIG. 2C shows the shaped leads 20A-E received into the clip base 32, and the clip cap 34 in place and connected to the base. The cap 34 is sized and configured to create a snap fit with the clip base 32, thereby keeping the leads 20A-E in place within the clip assembly 30. The cap 34 further includes a tongue 38 and recesses 40. The recesses 40 cooperate with posts 42 defined on the clip base 32 to ensure a close fit between the base and the cap 34 and to prevent unwanted movement of the cap.

In one embodiment, the clip assembly 30 is composed of a dielectric material so as to assist in matching impedance values along the transmissive path of which the leads 20A-E form a part. The tongue 38 projects from the cap 34 to assist in enveloping the leads 20A-E when they are received into the cavities 36A-E of the clip assembly 30, further enhancing the impedance controlling effects of the clip assembly. To comply with existing industry standards the clip assembly material should comply with UL 94V0 flammability ratings. Some acceptable materials from which the clip assembly can be composed include liquid crystal polymer ("LCP") and polyetherimide ("PEI"), commonly known as Ultem. These materials also offer good high temperature performance so as not to melt during the soldering operations discussed below. The clip assembly can be formed in these cases by injection molding, transfer molding, or other suitable forming processes. The clip assembly can also be composed of glass or a ceramic material. In some embodiments, presence of the clip assembly 30 can further enhance signal propagation speed, signal intensity, and other related signal characteristics.

It is thus seen that the particular composition of the clip assembly 30 can be modified in order to affect impedance of the leads 20A-E in a predetermined manner during optical transmission and reception activity at a given data rate, such as 1 Gbit/second. Also, the clip assembly can be modified from what is shown in the accompanying figures such that relatively more or less of each lead is enveloped by the clip. Further, though shown here as a permanent part of the shaped lead configuration, the clip assembly can alternatively be removed after the leads are shaped and attached to the printed circuit board so that it does not undesirably affect the electrical characteristics of the leads as discussed above. Alternatively, the shaped lead configuration of the present invention can be manufactured, attached, and employed without the use of a clip assembly, or the clip assembly can be placed on the leads after they have been shaped and otherwise configured for use.

Note that the forming device clip assembly can simplify the package manufacturing process by providing a substantially sized object for grasping during the device manufacturing process. Moreover, the clip assembly can strain-relieve the leads so as to reduce the potential for lead breakage during device manufacture and handling.

Figure 3:
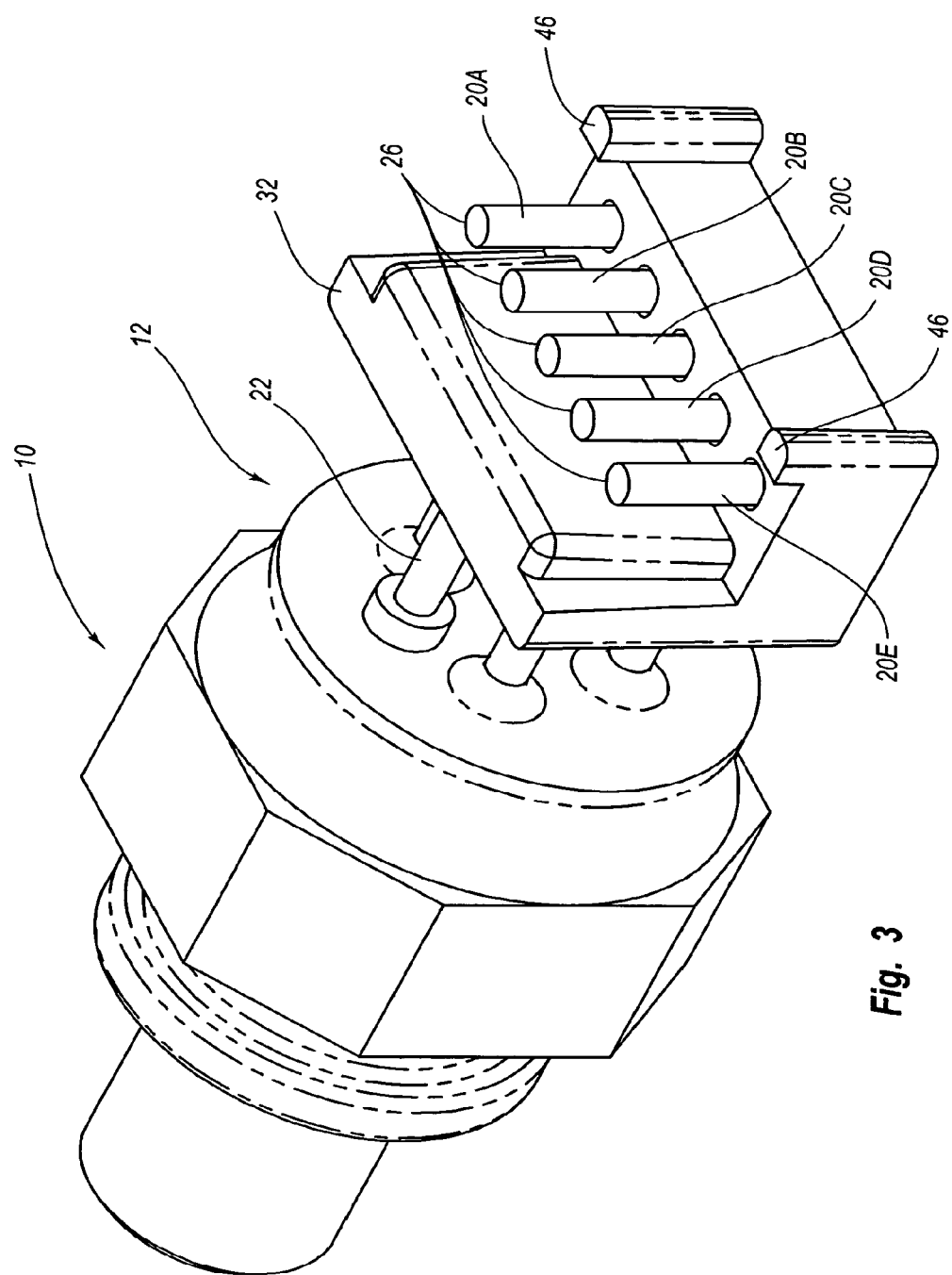
FIG. 3 is another view of the assembled shaped lead configuration and clip assembly of FIG. 2C.

FIG. 3 shows a bottom perspective view of the ROSA 10 of FIG. 2C. This perspective affords a view of the end portions 26 of the leads 20A-E that extend from holes defined in the L-shaped body of the clip base 32 for connection with a printed circuit board, as will be described. Also shown are two base extensions 46 that extend from a portion of the surface of the clip base 32 for use in assisting connection of the leads 20 to a printed circuit board, described blow.

Figure 4:
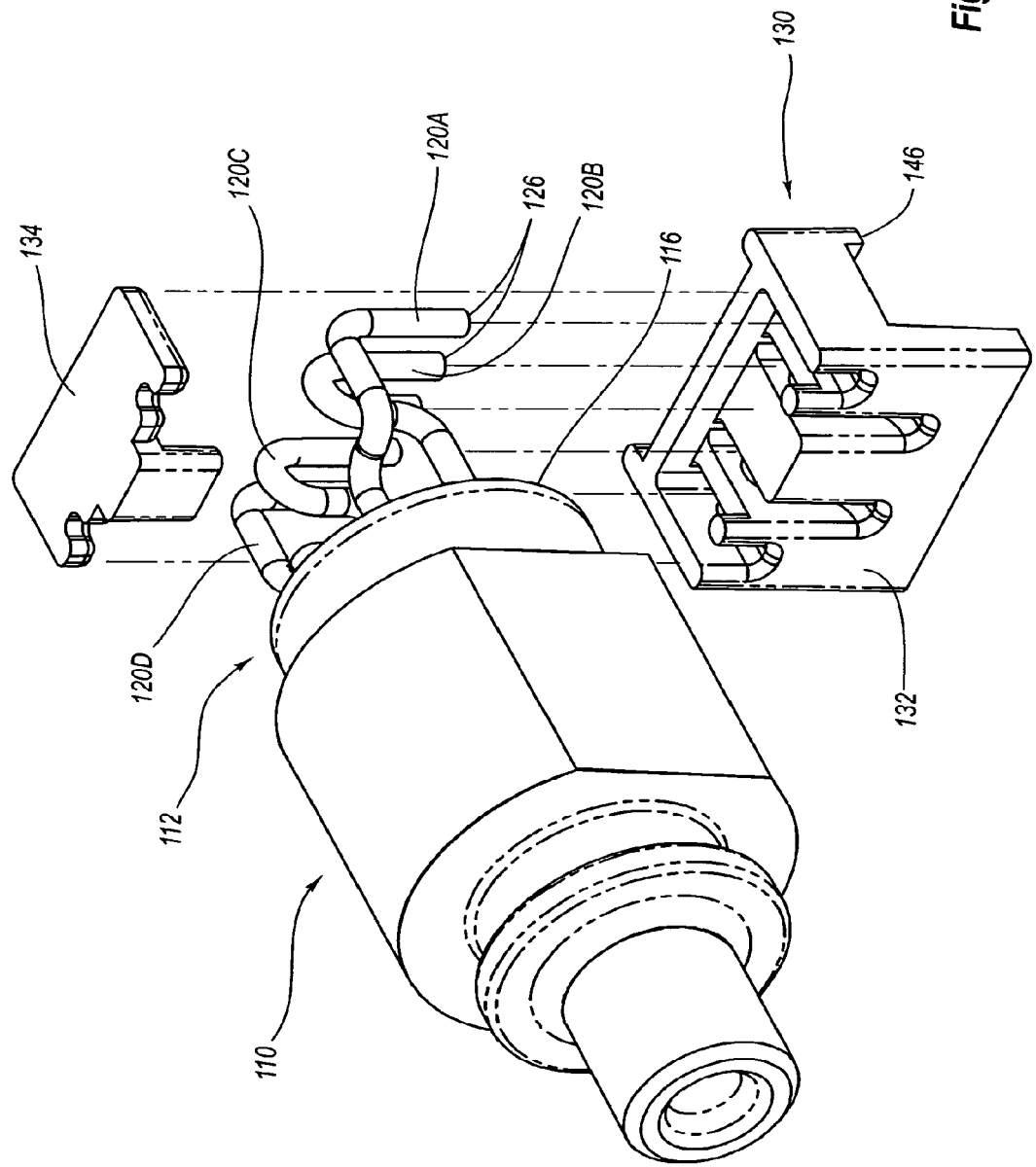
FIG. 4 is an exploded view of a transmitter optical subassembly including a shaped lead configuration and clip assembly according to another embodiment.

Reference is now made to FIG. 4, which shows various details regarding a transmitter optical subassembly ("TOSA"), generally depicted at 110, including a shaped lead configuration according to one embodiment. Like the ROSA above, the TOSA 110 serves as another example of an optoelectronic package. As many aspects are shared between this and the previous embodiment, only selected features of the present embodiment will be discussed here. The TOSA 110 includes a header 112 that houses one or more optoelectronic components, such as a laser diode, LED, etc. The header 112 includes a base 116 from which extend a plurality of leads 120A-120D. The leads 120A-D are shaped in a configuration similar to that described in connection with FIG. 1-2C, whereas the TOSA 110 includes only four leads compared to five leads for the ROSA 10. As such, the relative spacing between the leads 120A-D is adjusted from what was shown in FIGS. 1-3C. Note, however, that the leads 120B and 120C include shaped portions that are bent in a common plane, while the leads 120A and 120D have shaped portions defined in two substantially orthogonal planes.

A portion of each of the leads 120A-D is configured for receipt by cavities defined in a base portion 132 of a clip assembly 130 such that an end portion 126 of each lead extends therefrom. Also as before, a cap 134 is provided to mate with the clip base 132 and secure the leads within the clip assembly 130. Base extensions are also provided to enable ease of soldering when mating of the leads 120A-D with another structure, such as a printed circuit board, is performed.

In general, it will be appreciated that the structure of the device with which the shaped lead configuration of the present invention is implemented, such as the ROSA or TOSA or header, can conform to form factor requirements established in the industry. However, the present invention is not limited to such form factor requirements. As such, persons of ordinary skill in the art having the benefit of this disclosure will appreciate that the present invention is adaptable to various existing or yet-to-be-determined device form factors, some of which can be smaller or larger than what is shown and described herein.

Figure 5A:
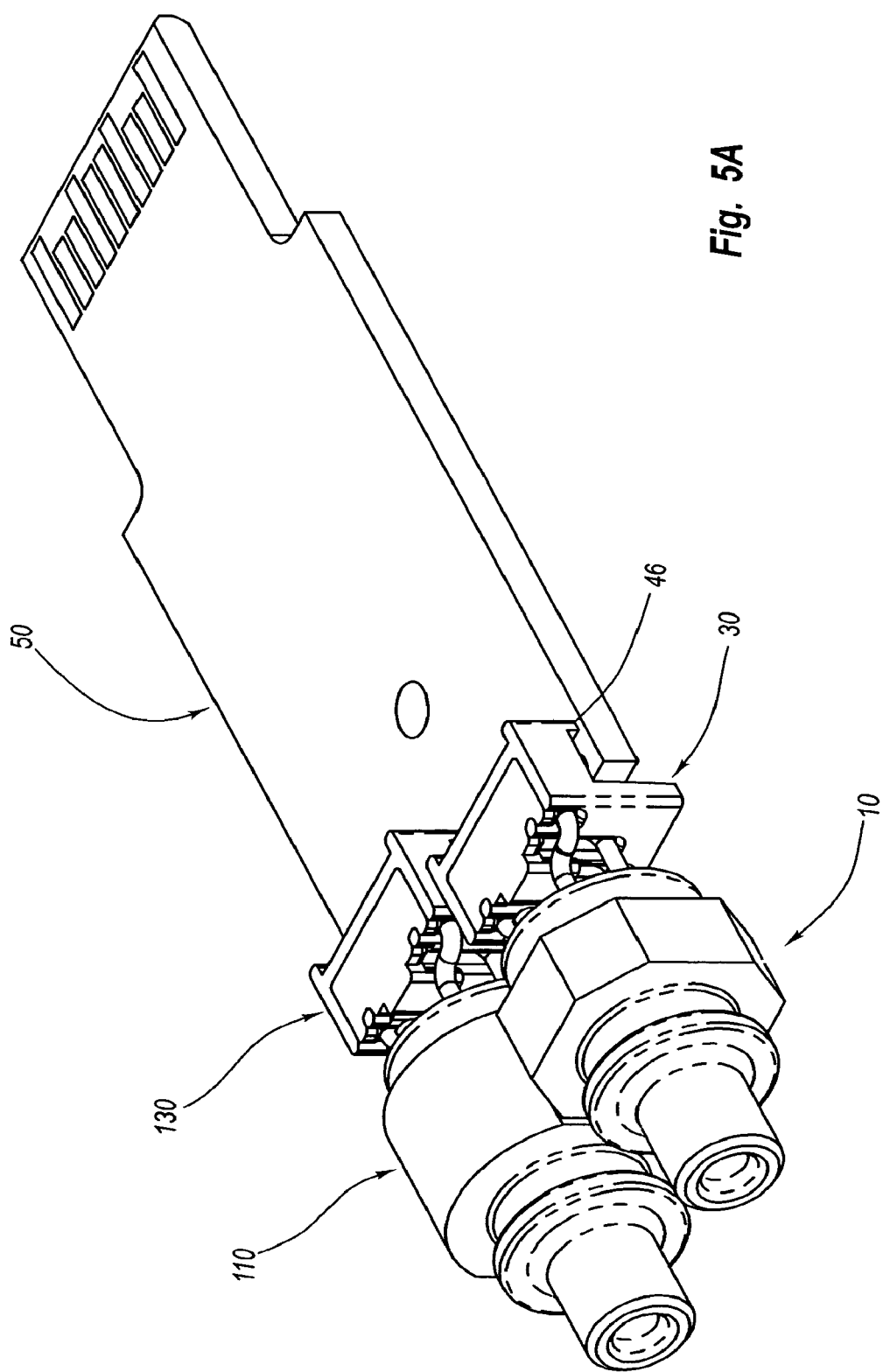
FIG. 5A is a perspective view of transmitter and receiver optical subassemblies attached to a printed circuit board via the shaped lead configuration and clip assembly of one embodiment.
Figure 5B:
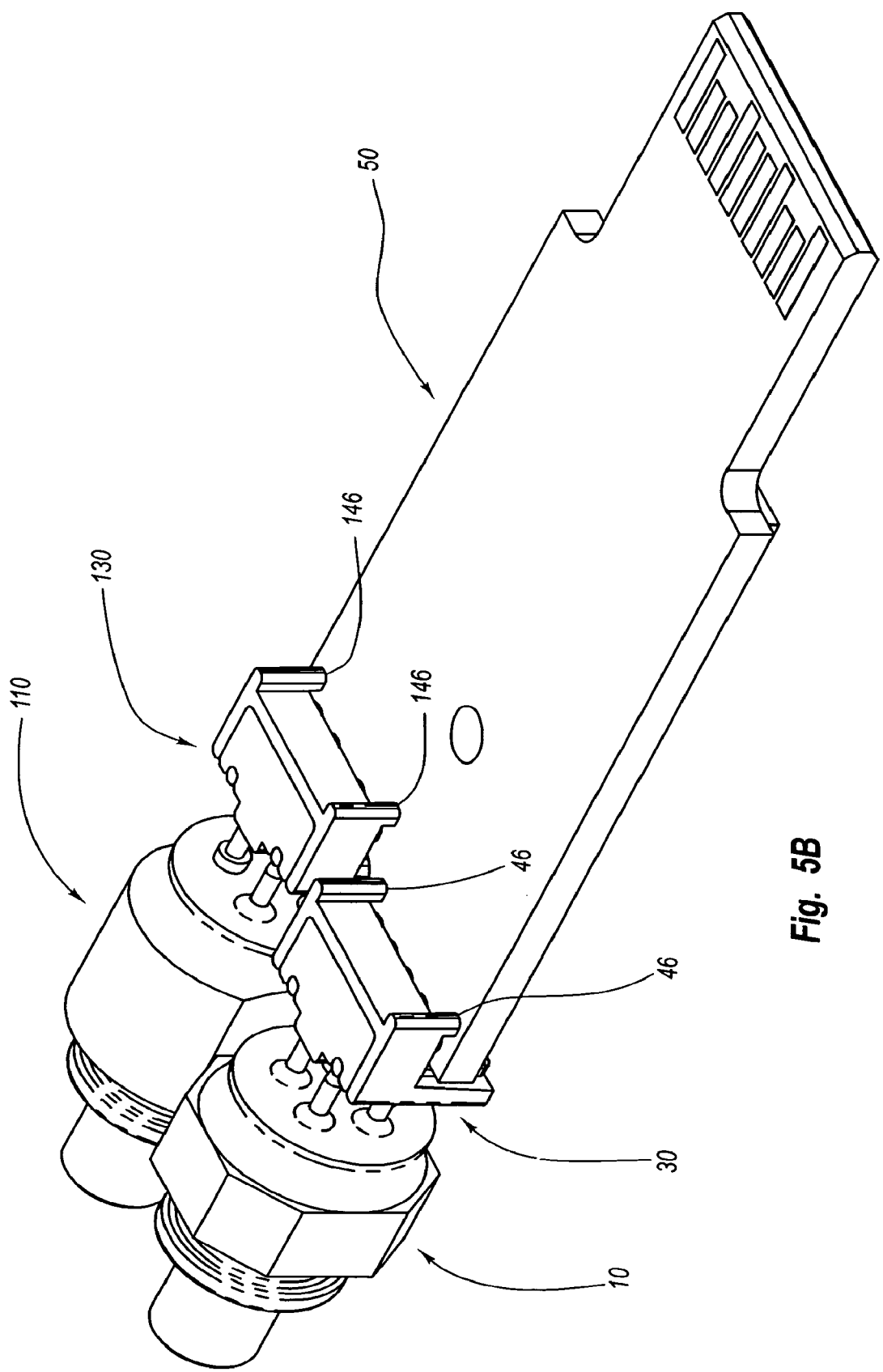
FIG. 5B is another perspective view of the configuration shown in FIG. 5A.

Reference is now made to FIGS. 5A, 5B and 6, which show various views of the ROSA 10 and TOSA 110 attached to a printed circuit board 50. In general, the description to follow regarding mating of the leads of the ROSA and TOSA to a printed circuit board can be generally extended, as appreciated by those skilled in the art, to the mating of a shaped lead configuration of the present invention with other structures and components not explicitly mentioned herein.

As shown, attachment between the ROSA 10, TOSA 110, and PCB 50 is achieved via the shaped lead frame configuration of the leads 20A-E and 120A-D as described above, together with the respective clip assemblies 30 and 130. In this way, the internal components of the ROSA 10 and TOSA 110 to which the leads are electrically connected can be in turn electrically connected with features on the PCB 50.

In particular, FIGS. 5A and 5B show a top view of the ROSA 10, the TOSA 110, and the PCB 50 in a mated configuration, while FIG. 6 shows a bottom view of these components positioned within an optical transceiver module ("transceiver"), generally designated at 200, according to one embodiment. The transceiver 200 includes a housing 210 in which the ROSA 10, TOSA 110 and PCB 50 are partially positioned, and an edge connector 220 located at an end of the PCB for allowing electrical connection with a device, such as a host system.

FIG. 6 further shows a plurality of through-hole vias 230 defined in the PCB 50 to extend between top and bottom surfaces of the PCB. The vias 230 are metallized as to be conductively plated and are in electrical communication with conductive features or components included with the PCB 50. The metallization of the vias 230 assists in forming an electrical interconnection between the vias and the leads of the ROSA 10 and/or TOSA 110, as will be described below.

As shown, the end portion 26 of each of the leads 20A-E, and the end portion 126 of each of the leads 120A-D are received by and extend into the corresponding vias 230. The lead end portions 126 are then soldered to attach to the vias 230. Though FIG. 6 shows a portion of each lead end portion 126 extending beyond the surface of the PCB 50, in other embodiments it may be desirable to have the end portion terminate flush with the PCB surface. The coupling of the leads 20A-E and 120A-D with the PCB 50 in this manner enables proper electrical communication to be established between the interior components of the package 12 and the PCB while, at the same time, avoiding the challenges common with other connection schemes.

The attachment scheme described above can be achieved as follows, with respect to the exemplary ROSA 10: manufacture of the ROSA with its respective header 12 is performed in the manner described herein so as to include the shaped configuration of leads 20A-E, shown in FIG. 1. The base 32 of the clip assembly 30 is then attached to the leads 20A-E such that the lead shaped portions 24 are received into the base cavities 36A-E. The cap 34 is then attached to the base 32 to complete the clip assembly 30. With the clip assembly 30 attached to the leads 20A-E, the leads are maintained in a desired orientation such that the end portions 26 of each lead can be readily inserted into the vias 230 of the PCB 50. The lead end portions 26 are inserted into the vias 230 such that the base extensions 46 of the clip assembly base 32 rest on the surface of the PCB 50. The lead end portions 26 are then soldered to the vias 230 to solidify the electrical connection therebetween. Because of the base extensions 46, the body of the clip assembly 30 rests slightly above the PCB surface (FIG. 5B), enabling a solder fillet to form about the perimeter of the via opening. This spacing further allows for visual inspection of the solder joint to ensure a reliable connection between the via and the end portion of each lead.

Note that the above configuration enables linearly arranged rows of lead end portions 26 and 126 to be received into corresponding linearly arranged vias on the PCB 50. In other embodiments, the lead end portions can be arranged in non-linear or other suitable positional relationships as may be desired for a particular application.

The shaped lead configuration as described herein allows for lead-to-PCB connection using through-hole technology while providing stress relief functionality between the leads and the PCB. Indeed, the shaped portion of each lead provides strain relief for the solder connection with the PCB so that stress experienced by the lead may be translated therethrough and dissipated in the shaped portion 49 rather than at the lead interface with the PCB. This results in a lead/PCB attachment that exceeds the holding strength of a similar attachment lacking such strain relief features. Also, use of the shaped lead configuration enables all lead attachments to occur on a single side of the PCB, thereby simplifying soldering operations.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. An optical subassembly, comprising:
    a header containing at least one optoelectronic component;
    a plurality of conductive leads that are in operable communication with the at least one optoelectronic component, each lead including:
        a straight portion extending from a surface of the header;
        an end portion oriented so as to be received by a through-hole via defined in a printed circuit board; and
        a shaped portion interposed between the straight and end portions and having at least one bend defined in a first plane; and
    a clip assembly having a plurality of cavities that each receive a corresponding one of the leads such that the end portion of each lead extends from a surface of the clip.

2. The optical subassembly as defined in claim 1, wherein the clip assembly maintains the orientation of the end portion of each lead in engaging a corresponding via defined in a printed circuit board.

3. The optical subassembly as defined in claim 2, wherein the clip assembly is formed from a material that assists in controlling impedances of the leads.

4. The optical subassembly as defined in claim 3, wherein the clip assembly further comprises:
    a base portion including the plurality of cavities; and
    a cap that removably attaches to the base portion.

5. The optical subassembly as defined in claim 4, wherein the cap includes a tongue that covers a portion of at least some of the leads, and wherein the base portion includes at least one post that cooperates with at least one recess defined in the cap.

6. The optical subassembly as defined in claim 5, wherein the base portion of the clip assembly includes extended portions that provide spacing between the base portion and a surface of the printed circuit board proximate the vias.

7. The optical subassembly as defined in claim 6, wherein the cavities include beveled surfaces to assist in receiving the leads.

8. The optical subassembly as defined in claim 7, wherein the leads are received by vias that are defined on a single surface of the printed circuit board.

9. The optical subassembly as defined in claim 1, wherein the optical subassembly is adapted for use in an optical transceiver module that includes:
 a housing; and
 said printed circuit board at least partially received by the housing.

10. The optical subassembly as defined in claim 1, wherein the plurality of conductive leads consists of five leads.

11. The optical subassembly as defined in claim 1, wherein the plurality of conductive leads consists of four leads.

12. The optical subassembly as defined in claim 1, wherein the optoelectronic component comprises an optical transmitter component.

13. The optical subassembly as defined in claim 1, wherein the optoelectronic component comprises an optical receiver component.

14. The optical transceiver module as defined in claim 1, wherein the shaped portion of each lead provides stress relief for retaining the end portion of the lead within the via.

15. The optical transceiver module as defined in claim 1, wherein the end portion of each lead is substantially orthogonal to the straight portion of the lead.

* * * * *

UNITED STATES PATENT AND TRADEMARK OFFICE
CERTIFICATE OF CORRECTION

PATENT NO. : 7,341,385 B2          Page 1 of 2
APPLICATION NO. : 11/537645
DATED : March 11, 2008
INVENTOR(S) : Ice It is certified that error appears in the above-identified patent and that said Letters Patent is hereby corrected as shown below:

Drawings
Sheet 8, Please replace the current drawing with the drawing below, wherein reference number "146" is changed to --46--

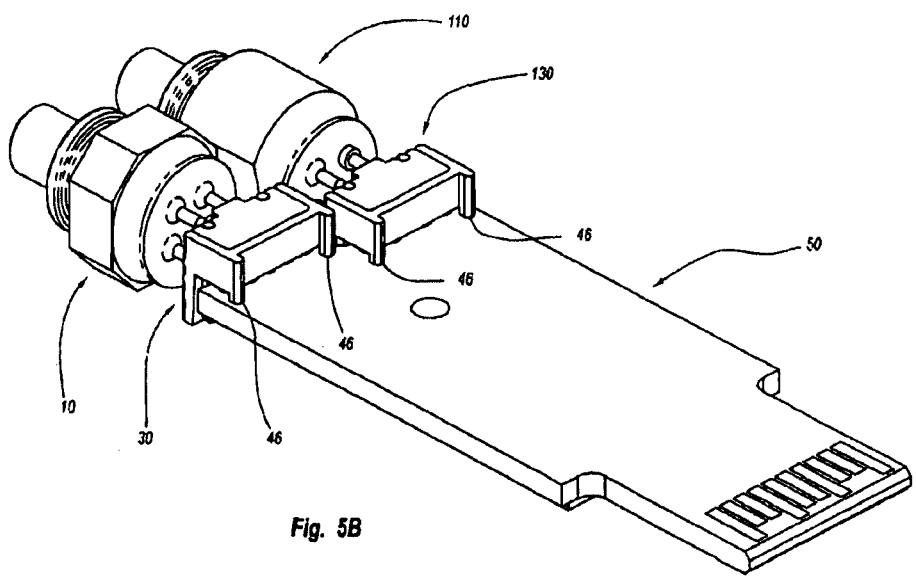

Fig. 5B

Signed and Sealed this
Fourth Day of January, 2011

David J. Kappos
*Director of the United States Patent and Trademark Office*

CERTIFICATE OF CORRECTION (continued)
U.S. Pat. No. 7,341,385 B2

Column 3
Line 31, change "electrically" to --electrical--

Column 7
Line 22, change "37" to --37 (FIG. 2A)--

Column 8
Line 24, change "20" to --20A-E--
Line 39, change "FIG. 1-2C" to --FIGS. 1-3C--

Column 10
Line 17, change "49" to --24--